(12) United States Patent
Liu et al.

(10) Patent No.: US 10,580,717 B2
(45) Date of Patent: Mar. 3, 2020

(54) MULTIPLE-CHIP PACKAGE WITH MULTIPLE THERMAL INTERFACE MATERIALS

(71) Applicant: Intel Corporation, Santa Clara, CA (US)

(72) Inventors: Boxi Liu, Chandler, AZ (US); Hemanth K. Dhavaleswarapu, Phoenix, AZ (US); Syadwad Jain, Chandler, AZ (US); James C. Matayabas, Jr., Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/774,990

(22) PCT Filed: Jan. 11, 2016

(86) PCT No.: PCT/US2016/012808
§ 371 (c)(1),
(2) Date: May 9, 2018

(87) PCT Pub. No.: WO2017/123188
PCT Pub. Date: Jul. 20, 2017

(65) Prior Publication Data
US 2018/0374776 A1 Dec. 27, 2018

(51) Int. Cl.
*H01L 23/373* (2006.01)
*H01L 23/367* (2006.01)
(Continued)

(52) U.S. Cl.
CPC ...... *H01L 23/3737* (2013.01); *H01L 21/4882* (2013.01); *H01L 23/3675* (2013.01);
(Continued)

(58) Field of Classification Search
CPC ... H01L 23/42; H01L 23/69; H01L 23/49838; H01L 23/367; H01L 23/3677;
(Continued)

(56) References Cited

U.S. PATENT DOCUMENTS

2003/0178730 A1* 9/2003 Rumer ............... H01L 23/4275
257/778
2008/0218971 A1* 9/2008 Coico ................ H01L 21/4871
361/704

(Continued)

FOREIGN PATENT DOCUMENTS

WO   WO 2009/035906   3/2009

OTHER PUBLICATIONS

International Preliminary Report on Patentablity for International Patent Application No. PCT/US2016/012808, dated Jul. 26, 2018, 11 pages.
(Continued)

*Primary Examiner* — Jasmine J Clark
(74) *Attorney, Agent, or Firm* — Schwabe, Williamson & Wyatt, P.C.

(57) ABSTRACT

A multiple chip package is described with multiple thermal interface materials. In one example, a package has a substrate, a first semiconductor die coupled to the substrate, a second semiconductor die coupled to the substrate, a heat spreader coupled to the die, wherein the first die has a first distance to the heat spreader and the second die has a second distance to the heat spreader, a first filled thermal interface material (TIM) between the first die and the heat spreader to mechanically and thermally couple the heat spreader to the die, and a second filled TIM between the second die and the heat spreader to mechanically and thermally couple the heat spreader to the second die.

19 Claims, 4 Drawing Sheets

(51) Int. Cl.
*H01L 25/065* (2006.01)
*H01L 25/18* (2006.01)
*H01L 23/42* (2006.01)
*H01L 23/00* (2006.01)
*H01L 23/48* (2006.01)
*H01L 21/48* (2006.01)
*H01L 23/498* (2006.01)
*H01L 23/15* (2006.01)
*H01L 23/538* (2006.01)

(52) U.S. Cl.
CPC .............. *H01L 23/42* (2013.01); *H01L 23/48* (2013.01); *H01L 24/29* (2013.01); *H01L 24/30* (2013.01); *H01L 25/0655* (2013.01); *H01L 25/18* (2013.01); *H01L 23/15* (2013.01); *H01L 23/3677* (2013.01); *H01L 23/49811* (2013.01); *H01L 23/49827* (2013.01); *H01L 23/5385* (2013.01); *H01L 24/32* (2013.01); *H01L 2224/16227* (2013.01); *H01L 2224/29324* (2013.01); *H01L 2224/29499* (2013.01); *H01L 2224/3003* (2013.01); *H01L 2224/30505* (2013.01); *H01L 2224/32245* (2013.01); *H01L 2224/73253* (2013.01); *H01L 2224/8121* (2013.01); *H01L 2224/81815* (2013.01); *H01L 2224/83191* (2013.01); *H01L 2224/83855* (2013.01); *H01L 2224/92225* (2013.01); *H01L 2924/0103* (2013.01); *H01L 2924/01005* (2013.01); *H01L 2924/01013* (2013.01); *H01L 2924/05032* (2013.01); *H01L 2924/0542* (2013.01); *H01L 2924/0543* (2013.01); *H01L 2924/05432* (2013.01); *H01L 2924/0715* (2013.01); *H01L 2924/15311* (2013.01); *H01L 2924/19105* (2013.01)

(58) Field of Classification Search
CPC . H01L 21/4882; H01L 25/0655; H01L 23/15; H01L 23/49811; H01L 23/49827; H01L 23/5385; H01L 23/48; H01L 23/3675; H01L 23/3737; H01L 24/30; H01L 25/065; H01L 2224/30505; H01L 2924/05432; H01L 2224/3003; H01L 2924/0715; H01L 2924/0543; H01L 2924/19105; H01L 2924/15311; H01L 2224/73253; H01L 2224/16225; H01L 24/48

See application file for complete search history.

(56) References Cited

U.S. PATENT DOCUMENTS

| | | |
|---|---|---|
| 2008/0242002 A1 | 10/2008 | Colgan |
| 2009/0166844 A1 | 7/2009 | Hu |
| 2010/0181665 A1* | 7/2010 | Casey .................... H01L 23/04 257/723 |
| 2014/0252634 A1 | 9/2014 | Hung |
| 2014/0264821 A1 | 9/2014 | Tank et al. |
| 2015/0155218 A1 | 6/2015 | Hung et al. |
| 2016/0315030 A1* | 10/2016 | Strader ............... H01L 23/3737 |

OTHER PUBLICATIONS

International Search Report and Written Opinion for International Patent Application No. PCT/US2016/012808 dated Oct. 10, 2016, 16 pgs.

Sylvain Ouimet et al. "Development of a 50mm Dual Flip Chip Plastic Land Grid Array Package for Server Applications." In: Electronic Components and Technology Conference, 2008. ECTC 2008. 58th, pp. 1900-1906.

Search Report from European Patent Application No. 16885297.8, dated Aug. 13, 2019, 9 pgs.

* cited by examiner

MULTIPLE-CHIP PACKAGE WITH MULTIPLE THERMAL INTERFACE MATERIALS

CROSS-REFERENCE TO RELATED APPLICATION

This patent application is a U.S. National Phase Application under 35 U.S.C. § 371 of International Application No. PCT/US2016/012808, filed Jan. 11, 2016, entitled "MULTIPLE-CHIP PACKAGE WITH MULTIPLE THERMAL INTERFACE MATERIALS," which designates the United States of America, the entire disclosure of which is hereby incorporated by reference in its entirety and for all purposes.

FIELD

The present description relates to thermal adhesives for micro-electronic and micromechanical packaging and in particular to multiple different adhesives in a single package.

BACKGROUND

In the assembly of semiconductor packages, greases, fillers and adhesives are used to attach covers and heat sinks to completed dies and to attach different parts of a package to each other. Because a semiconductor die heats with use, the different parts of a package, including the die will expand and contract. Any adhesive must allow for this expansion and contraction. As a result, greases and polymers are often used between parts. On the other hand, heat must be conducted away from the die so that it does not overheat during use. Greases and polymers are very poor heat conductors, but most heat conductors do not accommodate expansion and contraction between parts of the package.

Thermal interface materials (TIMs) are used to attach heat spreaders to a die and to attach heat sinks to a package. TIMs are designed to balance adhesion, flexibility, heat conductance, thermal stability, ease of use, and cost, among other factors. A variety of different formulations have been developed for different applications that feature different characteristics.

In order to make electronic devices smaller and faster, dies of different types and sizes are installed into the same package. These types of packages may be referred to as a system in a package (SiP), a multiple die module (MDM), or by other names, depending on the particular features and configuration of the die combination. A whole multiple die system may be integrated into a single die or only related components may be combined, such as a processor and local memory or an image processor and a camera controller.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

As described herein multiple dies of different sizes may be accommodated in a single package by using different formulations of thermal interface material (TIM). This approach may be applied to on-package integration of memory and fabric chips and to other types of packages with other types of dies.

Consider as an example, the high variations in the stack up tolerance for an example processor package that includes memory dies in the package. First, a typical TIM fills a certain bond line thickness (BLT) in order to ensure that the TIM can function as desired. A filled TIM is filled with small filler particles. It will have a minimum BLT that it can fill that is determined by the size of the largest filler particles. The BLT of the package is determined by the package design and the manufacturing process. A typical BLT may be 50 µm. There is a certain margin of error in the dimensions of a die of around ±10 µm and there is a margin of error needed for the heat spreader of around ±50 µm. These factors suggest that the TIM thickness for any one package may vary from about 50 µm to about 170 µm. However, with differences in die thickness from different designs, the TIM may have a 550 µm BLT to ensure good thermal coupling between the dies and the heat spreader.

Figure 1:
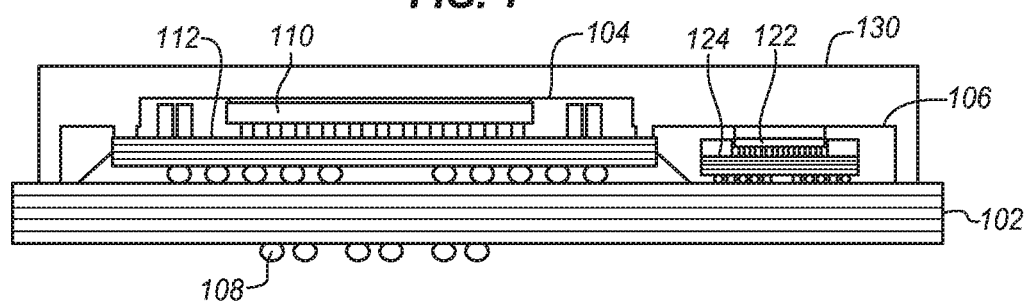
FIG. 1 is a cross-sectional side view diagram of multiple chip package according to an embodiment.

FIG. 1 is a cross-sectional side view diagram of a package in which two different types of dies are mounted side-by-side. The main or system package has a single system package substrate 102 made from silicon, ceramic, FR-4, build-up layers, or any of a variety of other materials. Two different internal packages 104, 106 are attached to the system package substrate with lands or pads soldered to the substrate.

A first larger internal package 104 has a die 110, mounted to an interposer 112 which is soldered to the system package substrate 102. An underfill 114 protects the connection between the interposer and the substrate. The internal packages may also include passives and other components, depending on the particular implementation. In the illustrated example, the larger die 110 may be a processor, mass storage, or some other complex die.

A second smaller internal package 106 is attached to the system package substrate 102 beside the larger package 104. The smaller internal package also has a die 122 on an interposer 124. This package is covered in a mold compound 126 and is also attached to the system substrate 102 using a solder ball array or grid. In this example, the smaller package may be a co-processor, an interface module, a local memory, or a radio system.

Different internal packages may be used inside the system package, depending on the implementation, and different types of internal packages may be packaged to suit different systems. The internal packages may include more than one die each. In one embodiment, the larger internal package is for a CPU (Central Processing Unit) die. Additional internal packages are for memory dies are memory dies. There may be multiple memory dies such as four or more dies which may be packaged together, in groups, or independently. In another embodiment, the second die may be a communication die, such as an external interface through wired or wireless links. Such a communication die for external components may be in the same system package with the memory dies and the CPU. In these examples, there are two or three different types of dies, however, there may be still more dies and more different types in one system package.

The type of interposer may be adapted to suit different scenarios. Alternatively, the packages may be use a redistribution layer, build-up layers, or the dies may be attached directly to the system package substrate 102. The packages may or may not be encapsulated or over-molded. Additional package and passive components may be added to suit different types of systems.

The system package is covered by a cover 130 that acts as a heat sink or heat spreader. In order to conduct heat away from both dies 110, 122, a thermal interface material 116, 128 is applied over each die, respectively before the cover is attached. The thermal interface material (TIM) is thermally conductive to conduct heat from the dies to the heat spreader. The thermal interface material may also serve as an adhesive to hold the heat spreader in place and to secure the heat conduction coupling between the two parts. The heat spreader may also be attached to the system package substrate 102 directly to secure it in position over the dies. In this example, the heat spreader is cemented to the system package substrate around the perimeter of the heat spreader and of the substrate.

As shown the thickness of the heat spreader varies across the width of the system package substrate. The cover is higher away from the substrate over the larger internal die and lower closer to the substrate from the smaller internal die. In this way the cover accommodates different sized components within the system package and allow for a smaller bond line thickness for the TIM. The heat sink or heat spreader may be made of any of a variety of different thermally conducting materials including copper and other metals. A larger heat sink (not shown) may be attached over the heat spreader, such as heat fins, heat pipes, or a liquid cooling and radiator system, depending on the particular implementation.

Figure 2:
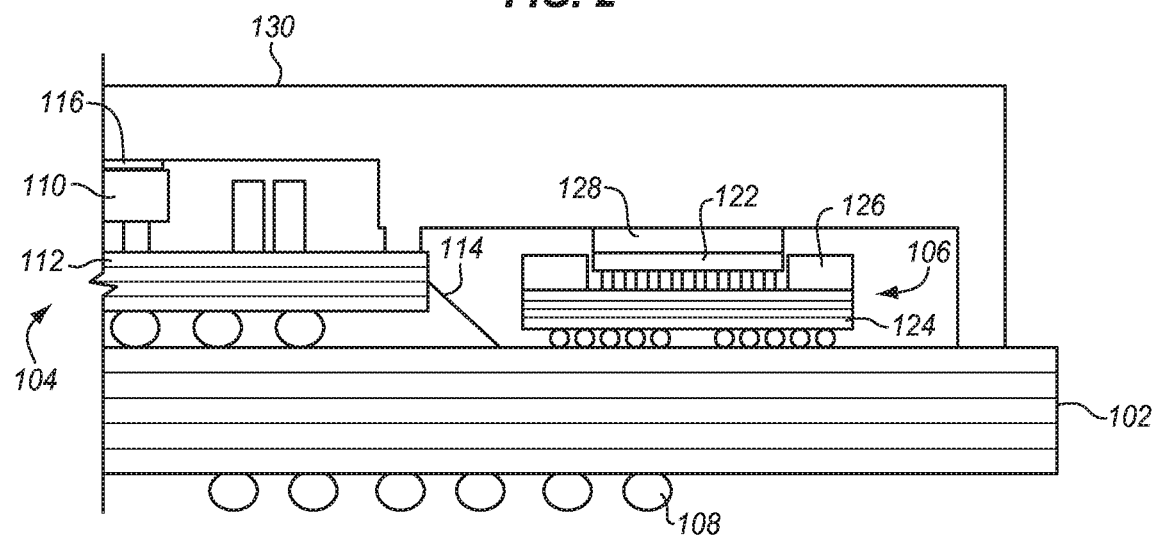
FIG. 2 is a cross-sectional enlarged side view diagram of a portion of FIG. 1 according to an embodiment.
Figure 3:
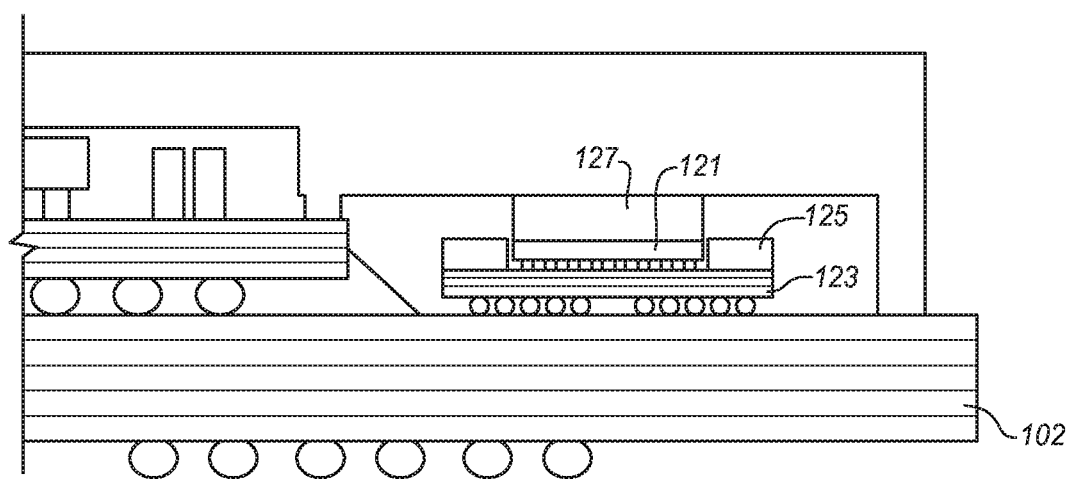
FIG. 3 is a cross-sectional enlarged side view diagram of the same portion of FIG. 1 as in FIG. 2 showing a variation according to an embodiment.

FIG. 2 is a cross-sectional side view diagram of a portion of FIG. 1 enlarged to show detail. FIG. 3 is a cross-sectional side view diagram of the same portion of FIG. 1 to show a variation in which the TIM 127 on a smaller package is thicker. In FIG. 3 a die 121 is also mounted to an interposer 123 on the right side of the package. The interposer is covered in a mold compound or encapsulant 125 which exposes the top surface of die 121. Comparing FIGS. 2 and 3, the TIM 128 in FIG. 2 is much thinner than the TIM 127 in FIG. 3.

The difference in die height may be caused by production variations, or by different manufacturing process. Each component in both the large and the small die has some manufacturing variation. The die thickness, the interposer thickness, and the solder joint thickness may vary from package to package. More parts and more layers in each internal package generally cause more variation in height. If either of these dies is a stacked multiple chip package, then there may be even more variation. In some embodiments, the same larger package may be packaged together with different smaller packages. The different smaller dies may be provided by different manufacturers or may provide different capacities, such as different amounts of memory, or different functions, such as a radio and an image co-processor. By using different smaller packages in the same system package, different applications may be served with the same form factor. This may simplify system integration.

FIGS. 2 and 3 show that a TIM may be required to conduct heat with different thicknesses. The thickness of the TIM and the height of a die from a package substrate may be referred to as a z-height, where x and y are the dimensions of the package substrate horizontally and through the plane of the page as shown in these drawings. While the dies may vary in z-height and the TIM may accordingly, vary in thickness, the thermal resistance requirements remain to conduct heat from the dies into the cover or heat spreader. Nevertheless the thermal resistance of a TIM becomes worse or increases as the thickness of the TIM is increased.

As an example the larger package may have a z-height variation of ±125 µm while the smaller package may have a z-height variation of ±250 µm. The bond line thickness may vary from 250 to 500 µm or more between different dies.

The thermal conductivity of a TIM may be controlled by using conductive filler particles that are adapted to different TIM thicknesses. For the lidded multiple chip package of FIG. 1, a different TIM may be used for the different dies to accommodate the different TIM thicknesses. More than one form of dispensable TIM in the lidded multi-chip package may be used. Each dispensable TIM may have a customized particle size and a customized filler particle loading to meet the thermal and the compressibility demands of the different dies in a package.

The thermal resistance of a polymer-based TIM may be determined largely using its heat transfer via percolation. The percolation theory of heat transfer is that heat is conducted through a particulate matrix mostly via chains of particles. A larger particle size will help reduce the thermal resistance by two mechanisms. First, thermal resistance is reduced by reducing the number of interfaces between particles. Second, thermal resistance is reduced by increasing the volumetric loading of the particles in the matrix. On the other hand, larger particles increase the minimum effective thickness of the TIM. In other words, a TIM with larger particles has a large minimum bond line thickness (BLT). The BLT and particle size are balanced based on the intended application.

The thermal challenges of MCP (Multi-Chip Packages) are met using a TIM that is optimized for each die. The TIM BLT and the TIM thermal resistance target of each die is used to determine the particle distribution and maximum particle size in the TIM to meet thermal demands. The compressibility, z-height variation, and adhesive requirements are additional factors. This provides a lower cost package than manufacturing the dies to higher tolerances or manufacturing different package covers.

Figure 4:
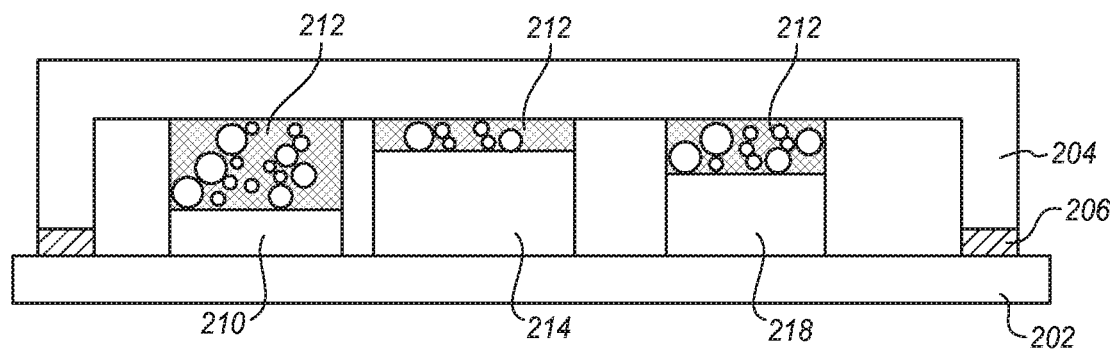
FIG. 4 is a simplified cross-sectional side view diagram of a multi-chip package according to an embodiment.

FIG. 4 is a simplified cross-sectional side view diagram of a multi-chip package in which each die or die stack has a different z-height. Alternatively, one or more of the die stacks may be an internal package as shown in FIG. 1. The package has a substrate 202 and a heat spreader 204 attached to the substrate with a sealant 206. There are three dies 210, 214, 218. The dies are directly attached to the substrate although there may be interposers, additional dies, or other components between a die and a substrate as in FIG. 1. A single TIM 212 is dispensed onto each die between the top of each die and the heat spreader. The thickness of the TIM adapts to suit the different z-heights of each die. As shown the TIM includes filler particles, such as aluminum or another metal.

All three dies are assembled with a single choice of dispensable TIM that is optimized in this case for the central die stack 214. However, the other die stacks 210, 218 suffer with higher resistance due to the larger BLT. If the TIM had instead been optimized for the outer die stacks 210, 218, then it might not have had the compressibility and BLT needed for the center die stack 214. If an average or intermediate type of TIM were used, then each die would have less than the best possible thermal conductivity with the heat spreader.

Figure 5:
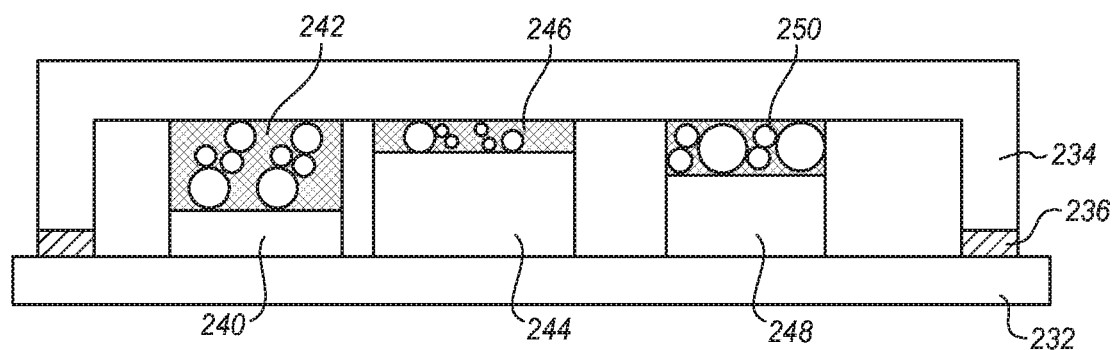
FIG. 5 is a simplified cross-sectional side view diagram of an alternative multi-chip package according to an embodiment.

FIG. 5 is a similar simplified cross-sectional side view diagram of an MCP package with three die stacks each using a different dispensable TIM optimized for the best thermal performance for each die. As in FIG. 4, there is a package substrate 232 with a cover 234 attached using a perimeter sealant 236. Three different dies or die stacks 240, 244, 248 are attached to the substrate, each with a different z-height and each with a different distance between the top of the respective die and the interior facing surface of the heat spreader.

There is a different TIM formulation 242, 246, 250 for each die, respectively. As shown the sizes and mix of sizes of the filler particles are different for each die. The different formulations may be independently dispensed and adapted for the particular needs of each die z-height and heat spreader distance. As a result, the thermal resistance is improved for two of the dies. If the dimensions and height variations for two dies or internal packages in an MCP are the same, then the same TIM may be used. The integrated circuit package 600 may include a plurality of solder balls 618 that are attached to a bottom surface 620 of the substrate 612. The solder balls 618 may be reflowed to attach the integrated circuit package 600 to a printed circuit board (not shown). The substrate 612 may contain routing traces, surface pads, power/ground planes and vias, etc., which electrically connect the solder balls 618 with the solder bumps 616. Although solder balls 618 are shown and described any of a variety of other connection may be used including pins, lands and pad.

The integrated circuit dies 240, 244, 248 generate heat, which is removed from the integrated circuit package through the heat spreader or cover 234. In some embodiments this is an integrated heat spreader (IHS). The IHS is thermally coupled to the integrated circuit dies by the TIMs 242, 246, 250 to absorb heat from the integrated circuit 614 and spread it across the larger surface of the IHS. The heat spreader may comprise metal and metal alloys optionally with a coating of another metal or may comprise a thermally conductive composite material. The TIMs are between the integrated circuit dies and the heat spreader to connect the two pieces together, to absorb mechanical stress from thermal cycling and to conduct heat.

A heat sink (not shown) may be attached to the heat spreader to enhance heat removal. The heat sink may be a metal plate with a plurality of fins, however, liquid coolers, heat pipes, or larger plates may be used. To decrease the thermal impedance between the IHS and the heat sink, another or the same thermal interface material may be applied and placed between the IHS and the heat sink. Other suitable materials may include a thermal grease and a phase change material depending on the nature of the heat sink. Increasing the thermal conductivity of the thermal interface materials increases the rate of heat flow and allows the die to operate at a lower temperature.

The packages described above are shown only as examples. A variety of other simpler or more complex packages may be used. There may be more or fewer dies in the package and more or fewer substrates including translation and interposer substrates. The package may be designed for or include a socket or be attached directly to a system board or other surface. The dies may be flipped, upright, or placed in any other position. While the present description refers to a semiconductor die, a micromechanical, or optical die may be used instead. The die may be silicon, ceramic, lithium niobate, gallium arsenide, or any other material or combination thereof. While the heat spreader is shown as surrounding and sealing the die against the package substrate, it may take other forms and may expose a portion of the die to ambient or another controlled environment.

To assemble the package as described above, a grid of C4 pads or other solder pads are pasted to the substrate 232 and the dies are placed onto the solder pads. The assembly is passed through a solder reflow furnace to melt the C4 pads and establish a solder connection between the dies and the substrate. The different TIMs are applied to the dies and the assembly is passed through a curing operation to cure the TIM and bond the die to the heat spreader. TIM or another adhesive may also be applied where the heat spreader contacts the package. In some cases, a dielectric adhesive may be preferred. The finished package may then be attached to a printed circuit board or a socket or any other device with solder balls or a fixture. The heat sink may be attached with an adhesive TIM or a mechanical clamp or in any of a variety of other ways depending on the particular implementation.

For a particle filled TIM, in order to improve the thermal conductivity of a TIM for a particular thickness, the particle size and the filler loading (percentage of particles to binder) may be adjusted. There may also be some particle materials that are more effective with different thicknesses. As mentioned above a thicker TIM benefits from a larger filler particle. The compression of the TIM is limited by the largest filler particle plus some margin for a small amount of binder and adhesive.

The multiple different dispensable TIMs may be integrated into existing package assembly processes. As an example, a dispenser might first dispense TIM over each left side die, then be reloaded with a different TIM and dispense TIM over each center die, etc. Alternatively a new three head dispenser may be used to simultaneously dispense a different TIM over each die of an MCP.

TABLE

| TIM | Mean Particle Size (μm) | Maximum particle size (μm) | Bulk K (w/mK) | Thermal Resistance (cm$^2$-K/W) |
|---|---|---|---|---|
| Ex. 1 | 12 | 42 | 4 | 1.2 |
| Ex. 2 | 40 | 160 | 7 | 0.9 |
| Ex. 3 | 40 | 120 | 7 | 0.8 |

The Table shows different filler loading and different thermal properties of three different variations of dispensable TIMs. As shown increasing the size of the filler particles from example 1 in examples 2 and 3 provides an increase in Bulk K. Filler loading may also be increased slightly for the larger particle size TIM. The main difference, however, is in the particle size. The mean particle size for examples 2 and 3 is increased from 12 μm to 40 μm. The bulk conductivity (K) is increased significantly by this change. As mentioned above, the BLT is also determined by the maximum particle size.

The thermal resistance is measured at a standard 450 μm z-height variation. This drops from about 1.2 cm$^2$-K/W based with a smaller 12 μm particle to 0.8 or 0.9 cm2-K/W for a larger 40 μm particle size.

The reduction in thermal resistance may be attributed at least in part to reducing the number of interfaces. Increasing the size of each particle reduces the number of particles that must be traversed for heat to flow from the surface of the die to the heat spreader. Each interface provides more thermal resistance than the filler particle material does. The many particle interfaces in a thick TIM thereby increase the thermal resistance. Larger particles through the same space increase the bulk thermal conductivity. In application, with a large TIM BLT, the bulk thermal resistance constitutes much of the total thermal resistance. Reducing the thermal resistance using larger particle sizes can significantly improve heat conduction to the heat spreader.

In example 1, the particles have a mean size=12 μm and a maximum particle size=42 μm. To increase the bulk thermal conductivity, a larger particle size may be used in example 2 with a mean particle size=40 μm and a maximum particle size=160 μm. This gives almost double the bulk K as shown in the Table with bulk K=7 W/mK.

To further improve the particle size for a TIM with larger particles the particles may be filtered. For a package in which a large z-height is accommodated, extensive filtration may be applied to reduce the maximum particle size, while maintaining the mean size unchanged or only slightly changed. This technique and adjustment to particle size may be used to maintain the high values for the bulk K. Example 3 from the table shows an optimized large particle size TIM produced using extensive filtration. The mean particle size is slightly reduced or not at all. The bulk K is slightly reduced or not at all to 7 W/mK and the maximum particle size is reduced from 160 μm to 120 μm. As a result, the thermal resistance under the same conditions is further reduced compared to example 2. In this case, using the 450 μm z-height variation, the thermal resistance for example 3 is about 0.8 cm$^2$-K/W. The filtered large particle size TIM can absorb more z-height variations than the example 2 version or its improved performance may be used to meet higher thermal demand.

The use of selectively optimized TIMs in a single package greatly increases the ability of the package to cool the dies inside. This may also be referred to as a higher TDP (Thermal Design Power). This allows for higher performance in more extreme environments. Existing dies can operate at higher speeds without changing any other aspect of a computing system design. It also allows more dies to be attached closer together in a single package for a smaller overall electronic device. The individually optimized TIMs also allow for the cost of cooling to be reduced. The heat spreader may be made less expensive by eliminating special cavities that account for different die heights. The heat sink such as heat fins, fans, etc. may also be made less expensive when the heat is transferred more effectively to the heat spreader.

The fillers described herein may be formed of aluminum, aluminum oxide, zinc oxide, aluminum nitride, and boron nitride, or other materials for a polymer TIM (PTIM). The filled TIM may be made by combining filler particles with a silicone resin. The silicone resin may be a mixture of vinyl siloxanes, hydrosilicones and catalyst. These may be mixed in a weight ratio of 85-95% filler to 2-15% silicone resin.

For a PTIM, a polymer matrix may be used to provide adhesion. The polymer matrix also affects the cured modulus of the resulting PTIM. A low modulus allows the cured matrix to absorb the thermal mechanical stress. A silicone based polymer matrix is a suitable material in many applications because it can reach a very low modulus (e.g. below 10 MPa).

The silicone resin may be based on a silicone matrix, which may be a siloxane crosslinked from silicone resin. Some example silicone resins for some embodiments include vinyl siloxanes, hydrosilicones and catalyst. Vinyl siloxanes are vinyl terminated or vinyl functional siloxanes. They may be used as the main component in a silicone matrix formulation. Hydrosilicones are siloxanes with —Si—H functional groups. Depending on the number of —Si—H functional groups, hydrosiloxane chains include both chain extenders (bi-functional) and crosslinkers (multi-functional). The catalyst may be Pt based, which can catalyze the hydrosilylation reactions between vinyl siloxanes and hydrosilicones to achieve the desired mechanical properties. Adhesion promoters, such as epoxy-containing silanes, are also added into the silicone resins to promote adhesion at die and lid interfaces.

Figure 6:
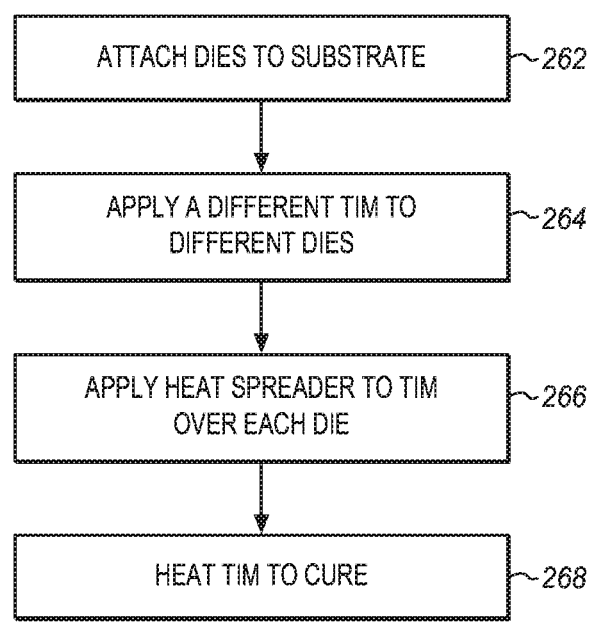
FIG. 6 is a process flow diagram of assembling a multi-chip package according to an embodiment.

FIG. 6 is a process flow diagram of forming a package using the described multiple TIMs. First, at 262 semiconductor dies are attached to a substrate. The dies may be of any type that generates heat in use. There may be many types of dies or a single type of die. There may also be passive electrical components and other connectors. The dies may be attached using a wire lead, flip chip, surface mount or any other desired technique. Different dies may be attached in different ways. The attached dies may be placed in a solder reflow furnace to solder all of the lands on the dies to pads on the package substrate. The solder reflow furnace is hot enough to reflow the solder without harming the die or the substrate and may be in the range of between 250° C. and 350° C.

At 264 after the die is attached, then a different thermal interface material (TIM) is applied to each die that has a different z-height or a different z-height variation or a different distance from the die to the heat spreader. The selection and fabrication of a particular TIM is selected based at least on the expected distance between the die and the heat spreader and the z-height variations. The TIM, as described herein, includes filler particles and a resin. The TIM may be applied by dispensing, by jet, or by a tape.

After the TIM is applied, then at 266 a heat spreader is attached to the thermal interface materials over the dies and over the substrate, to thermally and/or mechanically couple the heat spreader to the die.

With the heat spreader over the dies and with the TIMs between the dies and the heat spreader, the combined components are heated at 268. The heating of the substrate, the die, the TIM and the heat spreader has the effect of curing the thermal interface material. The heat is applied until the TIM has been cured. This may be done at a temperature below the solder reflow furnace temperature and typically at about 150° C. to 160° C. The actual temperature depends on the type of particles and the properties of the binder, among other factors and may be as low as 120° C. and as high as 250° C. in some embodiments.

Figure 7:
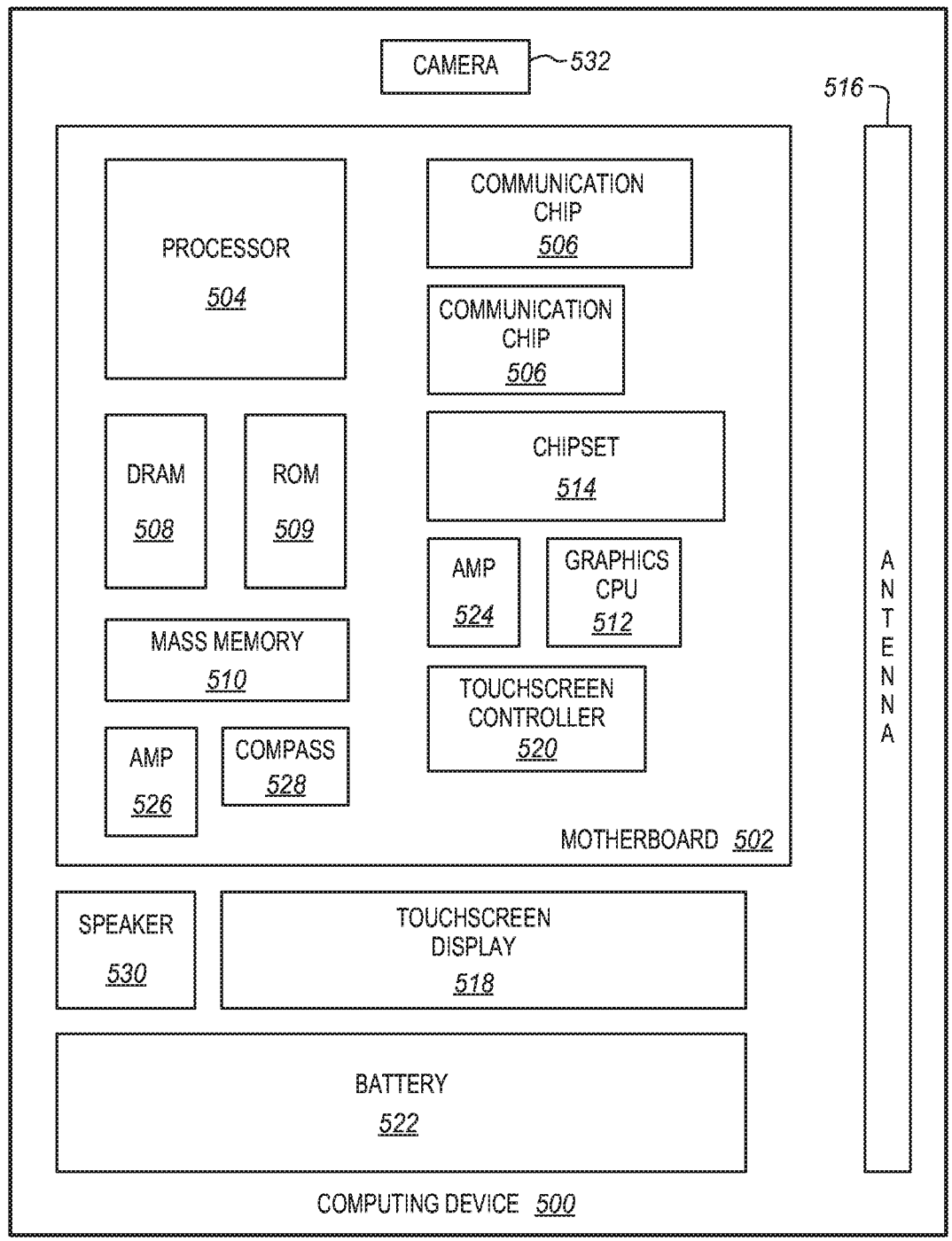
FIG. 7 is a block diagram of a computing device incorporating a microelectronic package according to an embodiment of the invention.

FIG. 7 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS. EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged using different TIMs as described herein. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a semiconductor package that includes a substrate, a first semiconductor die coupled to the substrate, a second semiconductor die coupled to the substrate, a heat spreader coupled to the die, wherein the first die has a first distance to the heat spreader and the second die has a second distance to the heat spreader, a first thermal interface material (TIM) between the first die and the heat spreader to mechanically and thermally couple the heat spreader to the die, and a second TIM between the second die and the heat spreader to mechanically and thermally couple the heat spreader to the second die.

In further embodiments the first and the second TIMs comprise thermally conductive particles and a polymer matrix.

In further embodiments the second distance is greater than the first distance and the particles of the second TIM are larger than the particles of the first TIM.

In further embodiments the particles of the first TIM have a mean size of about 10 µm and the particles of the second TIM have a mean size of about 40 µm.

In further embodiments the particles of the second TIM have a mean size greater than the first distance.

In further embodiments the particles of the second TIM are filtered to reduce the maximum size.

In further embodiments the particles contain aluminum.

In further embodiments the particles comprise at least one of aluminum, aluminum oxide, aluminum nitride, zinc oxide and boron nitride.

In further embodiments the first and second TIM are cured with heat.

In further embodiments the first and second TIM are cured at a temperature less than about 200° C.

In further embodiments the polymer matrix comprises a vinyl siloxane, hydrosilicone, and a catalyst. Further embodiments include a third semiconductor die coupled to the substrate and a third TIM between the third die and the heat spreader to mechanically and thermally couple the heat spreader to the third die, wherein the third die and a third distance to the heat spreader different from the first distance and the second distance.

In further embodiments the first die is a processor and the second die is a communication interface to external components.

Some embodiments pertain to a method of forming a semiconductor package that includes attaching a first semiconductor die to a substrate, attaching a second semiconductor die to the substrate, applying a first thermal interface material (TIM) to the first die, applying a second TIM to the second die, and attaching a heat spreader to the first and the second TIM over the first and the second die and over the substrate, to mechanically and thermally couple the heat spreader to the first and the second die, wherein the first die has a first distance to the heat spreader and the second die has a second distance to the heat spreader.

In further embodiments applying the first and the second TIM comprises dispensing the materials over the dies using a paste dispenser.

In further embodiments the second distance is greater than the first distance, wherein the first and the second TIMs include thermally conductive particles and wherein the particles of the second TIM are larger than the particles of the first TIM.

Further embodiments include curing the first and the second TIM using heat.

Some embodiments pertain to a computing system that includes a board, a memory connected to the board, and a semiconductor package connected to the board and to the memory through the board, the package comprising a substrate, a first semiconductor die coupled to the substrate, a second semiconductor die coupled to the substrate, a heat spreader coupled to the die, wherein the first die has a first distance to the heat spreader and the second die has a second distance to the heat spreader, a first filled thermal interface material (TIM) between the first die and the heat spreader to mechanically and thermally couple the heat spreader to the die, and a second filled TIM between the second die and the heat spreader to mechanically and thermally couple the heat spreader to the second die.

In further embodiments the second distance is greater than the first distance and the second TIM is filled with filler particles that are larger than the filler particles with which the first TIM is filled.

In further embodiments the first and the second TIMs comprise aluminum oxide particles and a polymer matrix.

The invention claimed is:

1. A semiconductor package comprising:
    a substrate;
    a first semiconductor die coupled to the substrate;
    a second semiconductor die coupled to the substrate;
    a heat spreader coupled to the first semiconductor die and the second semiconductor die, wherein the first semiconductor die has a first distance to the heat spreader and the second semiconductor die has a second distance to the heat spreader;
    a first thermal interface material (TIM) between the first semiconductor die and the heat spreader to mechanically and thermally couple the heat spreader to the first semiconductor die; and
    a second thermal interface material (TIM) between the second semiconductor die and the heat spreader to mechanically and thermally couple the heat spreader to the second semiconductor die, wherein the first and the second TIMs comprise:
        thermally conductive particles, wherein the second distance is greater than the first distance and the particles of the second TIM are larger than the particles of the first TIM or wherein the particles of the second TIM have a mean size greater than the first distance; and
        a polymer matrix.

2. The semiconductor package of claim 1, wherein the particles of the first TIM have a mean size of about 10 μm and the particles of the second TIM have a mean size of about 40 μm.

3. The semiconductor package of claim 1, wherein the particles of the second TIM are filtered to reduce the maximum size.

4. The semiconductor package of claim 1, wherein the particles contain aluminum.

5. The semiconductor package of claim 1, wherein the particles comprise at least one of aluminum, aluminum oxide, aluminum nitride, zinc oxide and boron nitride.

6. The semiconductor package of claim 1, wherein the first and second TIM are cured with heat.

7. The semiconductor package of claim 6, wherein the first and second TIM are cured at a temperature less than about 200° C.

8. The semiconductor package of claim 1, wherein the polymer matrix comprises a vinyl siloxane, hydrosilicone, and a catalyst.

9. The semiconductor package of claim 1, further comprising a third semiconductor die coupled to the substrate and a third TIM between the third semiconductor die and the heat spreader to mechanically and thermally couple the heat spreader to the third semiconductor die, wherein the third semiconductor die and a third distance to the heat spreader different from the first distance and the second distance.

10. The semiconductor package of claim 1, wherein first semiconductor die is a processor and the second semiconductor die is a communication interface to external components.

11. A method of forming a semiconductor package comprising:
    attaching a first semiconductor die to a substrate;
    attaching a second semiconductor die to the substrate;
    applying a first thermal interface material (TIM) to the first semiconductor die;
    applying a second thermal interface material (TIM) to the second semiconductor die; and
    attaching a heat spreader to the first and the second TIMs over the first and the second semiconductor die and over the substrate, to mechanically and thermally couple the heat spreader to the first and the second semiconductor die, wherein the first semiconductor die has a first distance to the heat spreader and the second semiconductor die has a second distance to the heat spreader, wherein the second distance is greater than the first distance, wherein the first and the second TIMs include thermally conductive particles and wherein the particles of the second TIM are larger than the particles of the first TIM.

12. The method of claim 11, wherein applying the first and the second TIM comprises dispensing the materials over the dies using a paste dispenser.

13. The method of claim 11, further comprising curing the first and the second TIM using heat.

14. A computing system comprising:
a board;
a memory connected to the board; and
a semiconductor package connected to the board and to the memory through the board, the package comprising a substrate, a first semiconductor die coupled to the substrate, a second semiconductor die coupled to the substrate, a heat spreader coupled to the first semiconductor die and the second semiconductor die, wherein the first semiconductor die has a first distance to the heat spreader and the second semiconductor die has a second distance to the heat spreader, a first filled thermal interface material (TIM) between the first semiconductor die and the heat spreader to mechanically and thermally couple the heat spreader to the first semiconductor die, and a second filled thermal interface material (TIM) between the second semiconductor die and the heat spreader to mechanically and thermally couple the heat spreader to the second semiconductor die, wherein the second distance is greater than the first distance and the second TIM is filled with filler particles that are larger than the filler particles with which the first TIM is filled.

15. The computing system of claim 14, wherein the first and the second TIMs comprise aluminum oxide particles and a polymer matrix.

16. A semiconductor package comprising:
a substrate;
a first semiconductor die coupled to the substrate;
a second semiconductor die coupled to the substrate;
a heat spreader coupled to the first semiconductor die and the second semiconductor die, wherein the first semiconductor die has a first distance to the heat spreader and the second semiconductor die has a second distance to the heat spreader, the second distance different than the first distance;
a first thermal interface material (TIM) between the first semiconductor die and the heat spreader to mechanically and thermally couple the heat spreader to the first semiconductor die;
a second thermal interface material (TIM) between the second semiconductor die and the heat spreader to mechanically and thermally couple the heat spreader to the second semiconductor die; and
a third semiconductor die coupled to the substrate and a third TIM between the third semiconductor die and the heat spreader to mechanically and thermally couple the heat spreader to the third semiconductor die, wherein the third semiconductor die has a third distance to the heat spreader different from the first distance and the second distance.

17. A semiconductor package comprising:
a substrate;
a first semiconductor die coupled to the substrate, wherein the first semiconductor die is a processor;
a second semiconductor die coupled to the substrate, wherein the second semiconductor die is a communication interface to external components;
a heat spreader coupled to the first semiconductor die and the second semiconductor die, wherein the first semiconductor die has a first distance to the heat spreader and the second semiconductor die has a second distance to the heat spreader;
a first thermal interface material (TIM) between the first semiconductor die and the heat spreader to mechanically and thermally couple the heat spreader to the first semiconductor die; and
a second thermal interface material (TIM) between the second semiconductor die and the heat spreader to mechanically and thermally couple the heat spreader to the second semiconductor die.

18. A computing system comprising:
a board;
a memory connected to the board; and
a semiconductor package connected to the board and to the memory through the board, the package comprising a substrate, a first semiconductor die coupled to the substrate, a second semiconductor die coupled to the substrate, a heat spreader coupled to the first semiconductor die and the second semiconductor die, wherein the first semiconductor die has a first distance to the heat spreader and the second semiconductor die has a second distance to the heat spreader, a first filled thermal interface material (TIM) between the first semiconductor die and the heat spreader to mechanically and thermally couple the heat spreader to the first semiconductor die, and a second filled thermal interface material (TIM) between the second semiconductor die and the heat spreader to mechanically and thermally couple the heat spreader to the second semiconductor die, wherein the first and the second TIMs comprise aluminum oxide particles and a polymer matrix.

19. A semiconductor package comprising:
a substrate;
a first semiconductor die coupled to the substrate, wherein the first semiconductor die is a processor;
a second semiconductor die coupled to the substrate, wherein the second semiconductor die is a communication interface to external components;
a heat spreader coupled to the first semiconductor die and the second semiconductor die, wherein the first semiconductor die has a first distance to the heat spreader and the second semiconductor die has a second distance to the heat spreader;
a first thermal interface material (TIM) between the first semiconductor die and the heat spreader to mechanically and thermally couple the heat spreader to the first semiconductor die; and
a second thermal interface material (TIM) between the second semiconductor die and the heat spreader to mechanically and thermally couple the heat spreader to the second semiconductor die, wherein the first and the second TIMs comprise:
thermally conductive particles; and
a polymer matrix.

* * * * *